United States Patent [19]
Nystrom et al.

[11] Patent Number: 5,412,351
[45] Date of Patent: May 2, 1995

[54] QUADRATURE LOCAL OSCILLATOR NETWORK

[76] Inventors: Christian Nystrom, Flintlasvagen 12, Sollentuna, Sweden, S-19154; Charles Persico, 1063 Morse Ave., #18-203, Sunnyvale, Calif. 94089

[21] Appl. No.: 132,903

[22] Filed: Oct. 7, 1993

[51] Int. Cl.$^6$ .................. H04L 27/20; H04L 27/22
[52] U.S. Cl. .................. 332/103; 329/305; 329/306; 332/105; 375/308; 375/329
[58] Field of Search .................. 331/38, 46; 332/103, 332/104, 105, 170; 329/304, 305, 306, 310, 357; 375/52, 53, 54, 67, 83, 86; 455/47, 109, 203

[56] References Cited

U.S. PATENT DOCUMENTS 3,390,343 6/1968 Carter .................. 455/203 X

Primary Examiner—Siegfried H. Grimm
Attorney, Agent, or Firm—Nixon & Vanderhye

[57] ABSTRACT

A compact local oscillator network for use in a quadrature modulator and/or demodulator is presented. Single side band circuitry is configured to produce quadrature signals with a high degree of accuracy such that two equal amplitude signals are generated having a precise 90° phase difference. The network accuracy is substantially not affected by phase or amplitude imbalances within or introduced into the network. For example, the network may include: a first quadrature circuit for dividing a first input signal into a first in-phase signal and a first quadrature signal 90° out of phase; a second quadrature circuit for dividing a second input signal into a second in-phase signal and a second quadrature signal 90° out of phase; a first mixer for mixing said first in-phase signal and said second in-phase signal; a second mixer for mixing said first quadrature signal and said second quadrature signal; a third mixer for mixing said first quadrature signal and said second in-phase signal; a fourth mixer for mixing said first in-phase signal and said second quadrature signal; a first combiner for combining the outputs of said first and second mixers into a first combiner for combining the outputs of said first and second mixers into a first local oscillator output signal; and a second combiner for combining the outputs of said third and fourth mixers into a second local oscillator output signal.

20 Claims, 7 Drawing Sheets

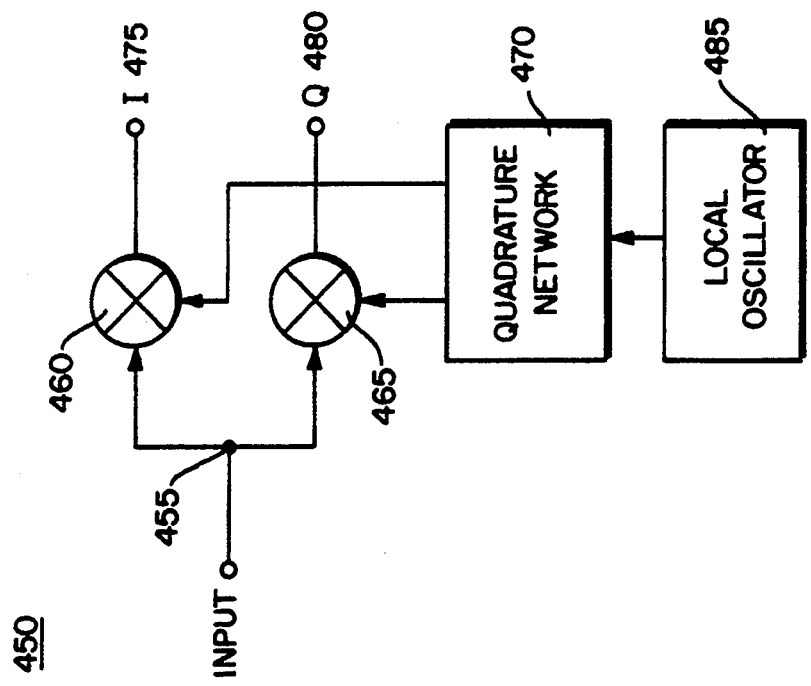
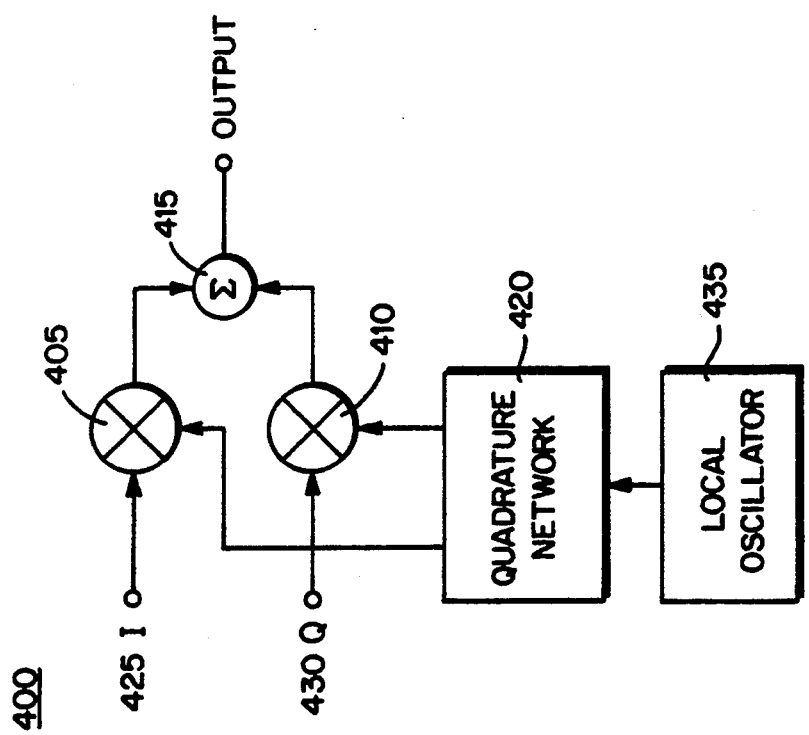

QPSK-CONSTELLATION

CONSTELLATION

545

π/4 - SHIFTED QPSK

MODULATOR

QUADRATURE LOCAL OSCILLATOR NETWORK

FIELD OF THE INVENTION

The present invention relates to a quadrature local oscillator network for use for example in a quadrature modulator (or demodulator) to produce quadrature signals with a high degree of accuracy. More particularly, the present invention is directed to a quadrature local oscillator network in which the accuracy of the quadrature signals is substantially unaffected by phase or amplitude imbalances in the network.

BACKGROUND AND SUMMARY OF THE INVENTION

Quadrature networks are indispensable components used in virtually all kinds of radio frequency circuits. An ideal quadrature network is a three port device that produces from a single input two equal amplitude signals separated in phase by exactly 90 degrees. An ideal quadrature network 140 is illustrated in FIG. 1 where a sinusoidal input signal 100 is processed to produce an in-phase output 110 with a normalized amplitude that is $1/\sqrt{2}$ of the original signal amplitude and a quadrature-phase (hereafter "quadrature") signal 120 also $1/\sqrt{2}$ of the original signal amplitude which is shifter $\pi/2$ radians from the in-phase signal 110. The two output signals should have a relative phase shift of $\pi/2$ radians (90°). Typically, quadrature networks produce an in-phase signal 110 that leads the input signal by $\pi/4$ and a quadrature signal 120 that lags the input signal 100 by $\pi/4$, i.e. for a total $\pi/2$ phase shift.

At microwave frequencies, quadrature networks may be realized by an arrangement of coupled transmission lines. Two examples 150, 160 of coupled transmission line quadrature networks are shown in FIG. 2. The size of these quadrature networks generally approaches that of a quarter wavelength $\lambda/4$ of the operating frequency and results in compact designs at microwave frequencies. Unfortunately, at UHF (e.g. 800 MHz), the large size of these coupled transmission line quadrature networks makes them extremely inconvenient for incorporation in relatively small radio units, e.g. hand held portable or mobile radiotelephones. Lacking the necessary ability to further miniaturize, transmission line quadrature networks are also not suitable for incorporation into Application Specific Intergrated Circuit (ASIC) devices.

One example of a compact form of quadrature network that may be used as part of an ASIC device is shown in FIG. 3. A so-called reactive quadrature network 300 is constructed from resistors and capacitors (as configured in the drawing) to realize a high-pass filter 334 and low-pass filter 332 combination. The selection of the 75 ohm resistors 325 and the 18 pF capacitors 320 produces a crossover frequency Fc (in this example) of approximately 116 MHz. The 50 ohm input and output resistors 330 provide impedance matching. Obviously, other resistor and capacitor values would be used to provide operation at different frequencies.

The function of quadrature network 300 is illustrated by output signal phase 340 and output signal amplitude 350 graphs shown in FIGS. 4(a) and 4(b), respectively. As indicated by the graph of output phase 340, the in-phase output 310 leads input signal 305 by 45°, and the quadrature signal 325 lags the input signal by an equal amount. This results in a 90°, or quadrature, relationship between output signals that is essentially independent of frequency. The high-pass/low-pass nature of the quadrature network 300 is illustrated by the output signal amplitude graph 350. The in-phase output 310 is connected to the high-pass filter 334, and the in-phase output 310 increases in signal amplitude with increasing frequency. Conversely, the quadrature output 315 is connected to the low-pass filter 332 and increases in signal amplitude with decreasing frequency. At the crossover frequency, Fc, the signal amplitudes of both the in-phase and quadrature signals are equivalent, and the quadrature network acts as a power splitter with approximately 5 dB of resistive loss in addition to the 3 dB power split. In order words, each output signal contains exactly half of the total output power.

Although the relative quadrature phase difference (i.e. 90°) is essentially frequency independent as can be seen in FIG. 4(a), the power split is strongly a function of frequency. For example, with increased frequency beyond $F_c$, the in-phase output is at a higher power than the quadrature output. It is difficult in practice to achieve both optimal quadrature performance and an equal power split. In addition to these frequency dependent effects, inequalities due to process spread, temperature, etc. in the resistors 325 and capacitors 320 also result in imbalances to the quadrature phase difference and power split.

Another type of compact quadrature network is a doubler-divider circuit where a mixer or other non-linear device is used to double the frequency of the input signal. Two frequency dividers then reproduce the original frequency using the positive and negative slopes of the doubled signal to generate the 90 degree offset. This technique is somewhat limited depending on frequency range because of the requirement that the RF signal be doubled. For example, at 800 MHz the doubler-divider circuit must operate at 1.6 GHz which exceeds the operating speeds of most silicon ASICs.

Quadrature networks are often used in the modulation and demodulation of voice communication signals. Modulation is the process by which the information content of an audio signal is transferred to an RF carrier for transmission. The inverse process (i.e., recovering the audio information from an RF signal) is called demodulation. The modulation process causes some property, such as the amplitude, frequency, or phase, of a high-frequency carrier to be deviated from its unmodulated value by an amount equal to the instantaneous value of the modulation (e.g. voice) signal. There are many forms of modulation/demodulation of which amplitude modulation, (AM), and frequency modulation, (FM), are perhaps the most well know. More complex modulation techniques which are often used with various digital signaling schemes require the use of a quadrature modulator. Quadrature modulation is advantageous (relative to purely AM and FM) in reducing spectral occupancy, obtaining voice privacy, reducing envelope fluctuation, and reducing transmit power demands.

In digital communications, all quadrature modulation techniques begin with an analog voice signal being sampled and converted into a digital data stream. In the simplest form of quadrature modulation, quadrature phase shift keying (QPSK), the audio information is separated into two individual digital data streams: the I, for in-phase digital data stream 425, and Q, for quadrature digital data stream 430, as shown in FIG. 5(a). Each of these data streams is individually mixed in respective mixers 405 and 410 with a local oscillator signal 435 that has been passed through a quadrature local oscillator network 420. The "ideal" quadrature network 420 splits the signal from local oscillator 435 into two equal amplitude signals at the same carrier frequency but separated in phase by exactly 90°. The in-phase signal I 425 is mixed with the in-phase cosine wave from network 42 and the quadrature signal Q 430 is mixed with the quadrature sine wave from network 420. The two modulated signals (i.e. the I and Q information two modulated signals (i.e. the I and Q information modulate the local oscillator carriers) output from mixers 405 and 410 are combined in summer 415 to produce a single QPSK modulated output signal.

On the receiving end, an ideal QPSK demodulator 450 shown in FIG. 5(b) recovers the original data streams. The QPSK demodulator 450 first splits the received input signal into two equal parts which are separately fed into the in-phase mixer 460 and the quadrature mixer 465. The mixers are fed with quadrature signals provided by the "ideal" quadrature network 470. After some post-mixing filtering (not shown), the individual I and Q digital data streams 475 and 480 are recovered.

QPSK modulation produces a four point constellation 485 in the complex power domain (sometimes referred to as a phase diagram) shown in FIG. 5(c). QPSK modulation causes the QPSK modulator 400 output signal, which shifts between the values (0,0), (0,1), (1,0), and (1,1) depending on the I and Q channel values, to occasionally swing through zero output power. The resulting envelope fluctuation between zero and some maximum output power requires the use of a low-efficiency linear power amplifier to avoid distortion and spectral spreading.

Envelope fluctuations and their deleterious effects can be reduced by using a more complicated form of quadrature modulation known as $\pi/4$-shifted quadrature phase shift keying or $\pi/4$-shifted APSK. FIG. 6(a) shows a $\pi/4$-shifted QPSK modulator that operates exactly as the QPSK modulator 400 described in conjunction with FIG. 5(a) except that the output signal is alternately shifted by $\pi/4$ radians. This shift is not shown in the figure because it is preferably accomplished computationally by adding a $\pi/4$ shift to the I and Q bit streams on alternate cycles using for example a digital signal processor (DSP). This $\pi/4$-shifted QPSK output produces the constellation 545 shown in FIG. 6(b) where it may be seen that zero output power crossings are avoided, thereby permitting the use of high efficiency nonlinear power amplifiers. To achieve this benefit, the IS-54 standard for North American digital cellular communications specifies that the modulation be based on the differential phase rather than the absolute phase of the received signal, defined above as $\pi/4$-shifted DQPSK.

Unfortunately, in practical quadrature networks (as opposed to the ideal quadrature networks described above), amplitude and phase imbalances in those networks distort the shape of the transmitted or received constellation. As the constellation of the modulated output is distorted, it becomes increasingly more difficult to correctly identify the actual phase of the received signal. Errors in phase identification result in increased bit errors in the I and Q data streams. As the number and frequency of these bit errors increase, the overall quality of the reconstructed voice signal is reduced. Since voice quality is a primary goal of any voice communication system, it is essential that phase and amplitude errors in the quadrature networks of these modulators be reduced.

Quadrature networks also find application in single side-band (SSB) upconverters. Upconversion is the process by which two sinusoidal signals are multiplied together (i.e. mixed), to produce a frequency which is the sum (upper sideband) or difference (lower sideband) of the constituent frequencies. Referring to the SSB upconverter 600 shown in FIG. 7, an intermediate frequency (IF) oscillator signal 610 (the signal to be "upconverted") is passed through a quadrature network 620 whose outputs are fed into two separate mixers 660, 650. An output signal from RF oscillator 630 is passed through a quadrature network 640 whose outputs are also fed into the mixers 660, 650 as shown. The difference frequencies (i.e. the lower sidebands) generated by each of these mixers are fed into the summing junction 670 (ideally) 180 degrees out of phase with one another. Accordingly, the lower sidebands cancel each other and are thereby eliminated. An advantage of SSB upconverters is that they do not require the use of a sharp cutoff filter to remove the difference frequency. A disadvantage of SSB is that any phase or amplitude imbalance in either of the quadrature networks 620, 640 results in incomplete cancellation of the difference frequency thereby producing unwanted spurious outputs.

The present invention provides an improved quadrature network that substantially reduces the sensitivity to amplitude and phase errors in generating quadrature LO signals. First and second single side band (SSB) networks receive first and second input signals. The first SSB network mixes in-phase components of the first and second input signals and quadrature components of the first and second input signals and combines these first mixed signals to generate an in-phase signal. The second SSB network selectively mixes in-phase and quadrature components of the input signals and combines these selectively mixed signals to generate a quadrature signal. The thus generated in-phase and quadrature signals are equal in amplitude and out of phase by 90°. Any amplitude or phase imbalance between any of the in-phase and quadrature components is substantially eliminated in the quadrature network. As a result, the quadrature local oscillator network according to the present invention is insensitive to component manufacturing tolerances and temperature effects, and is particularly useful in quadrature modulators and demodulators used in mobile/portable voice communication systems both in radiotelephones and in base stations.

BRIEF DESCRIPTION OF THE DRAWINGS

These and other features and advantages of the present invention will be readily apparent to one of ordinary skill in the art from the following written description, read in conjunction with the drawings, in which:

FIGS. 5(a)–5(c) illustrate a QPSK modulator/demodulator constructed using quadrature networks and the resulting constellation;

DESCRIPTION OF THE PREFERRED EMBODIMENTS

In the following description, for purposes of explanation and not limitation, specific details are set forth, such as particular circuits, circuit components, techniques, etc. in order to provide a thorough understanding of the present invention. However, it will be apparent to one skilled in the art that the present invention may be practiced in other embodiments that depart from these specific details. In other instances, detailed descriptions of well-known methods, devices, and circuits are omitted so as not to obscure the description of the present invention with unnecessary detail.

Figure 8:
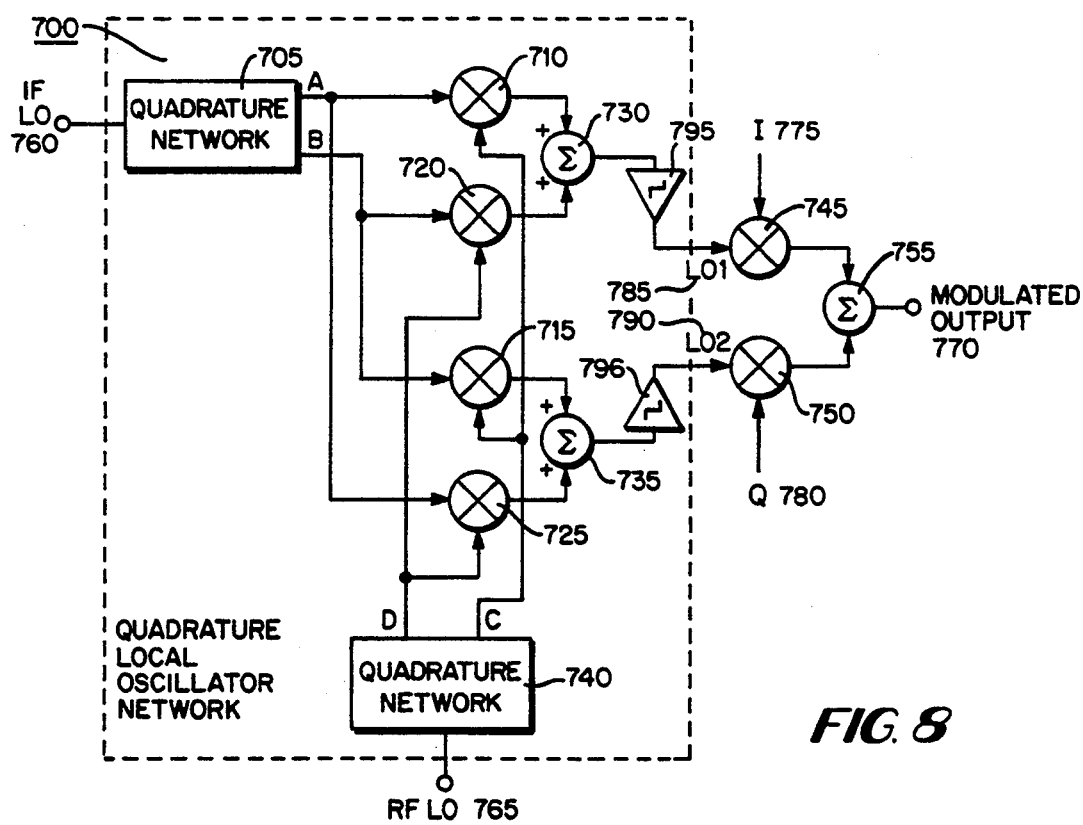
FIG. 8 shows a quadrature network configured as part of a QPSK modulator according to the present invention.

The preferred embodiment of the present invention as shown in FIG. 8 consists of a quadrature local oscillator network 700 configured as part of a quadrature modulator (for example). Both the in-phase local oscillator output (L01) 785 and the quadrature local oscillator output (L02) 790 are generated using SSB upconversion principles and circuitry to produce two substantially equal amplitude signals with an accurate quadrature phase relationship. Mathematically it can be shown that the quadrature phase relationship and relative signal amplitude of the output signals 785, 790 generated by the quadrature network 700 according to the present invention are substantially insensitive to phase and amplitude errors/imbalances in the reactive quadrature networks 705, 740. This analysis also helps to explain the operation of the invention.

Figure 1:
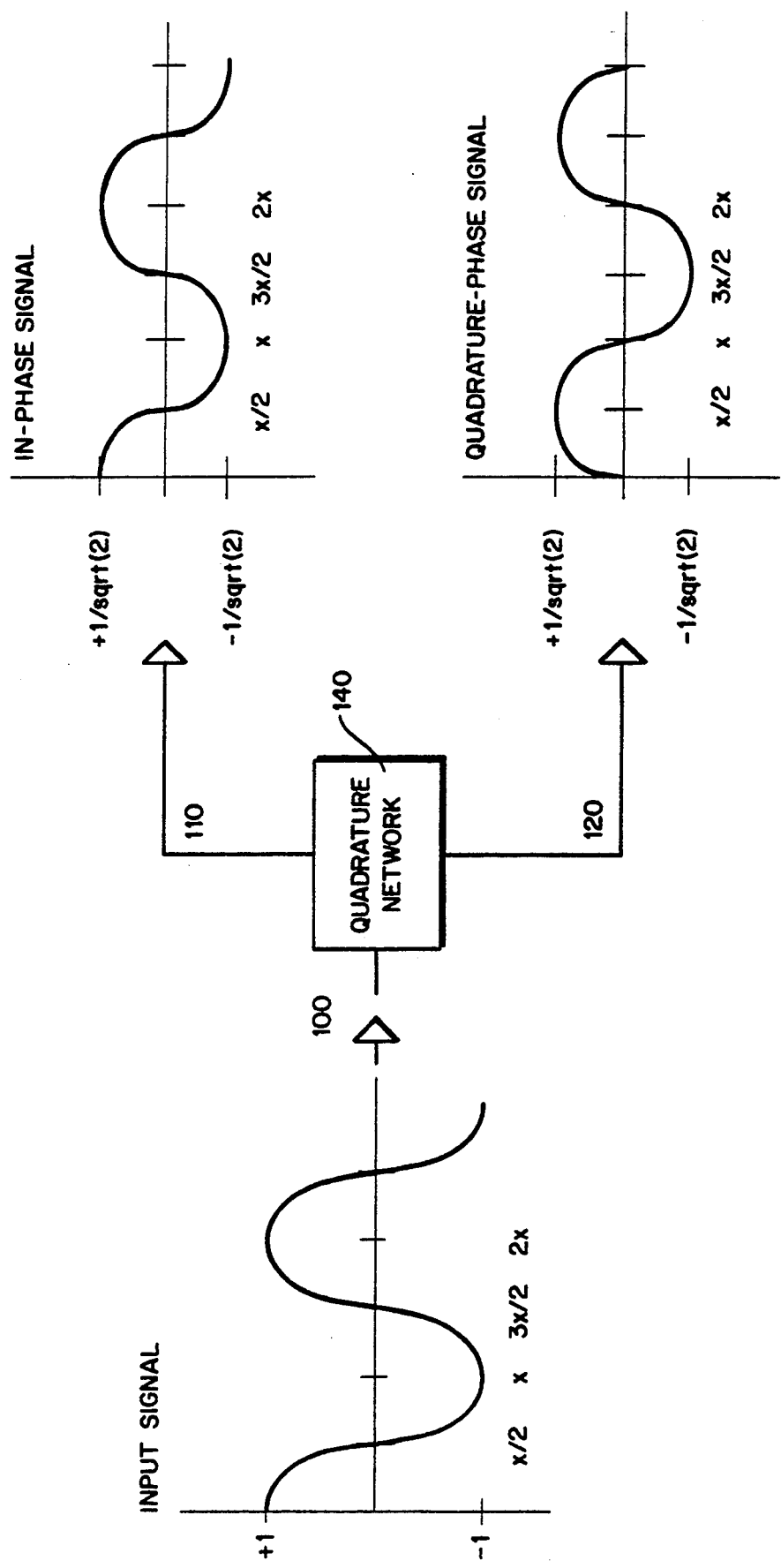
FIG. 1 is an illustration demonstrating the operation of an ideal quadrature network.
Figure 2:
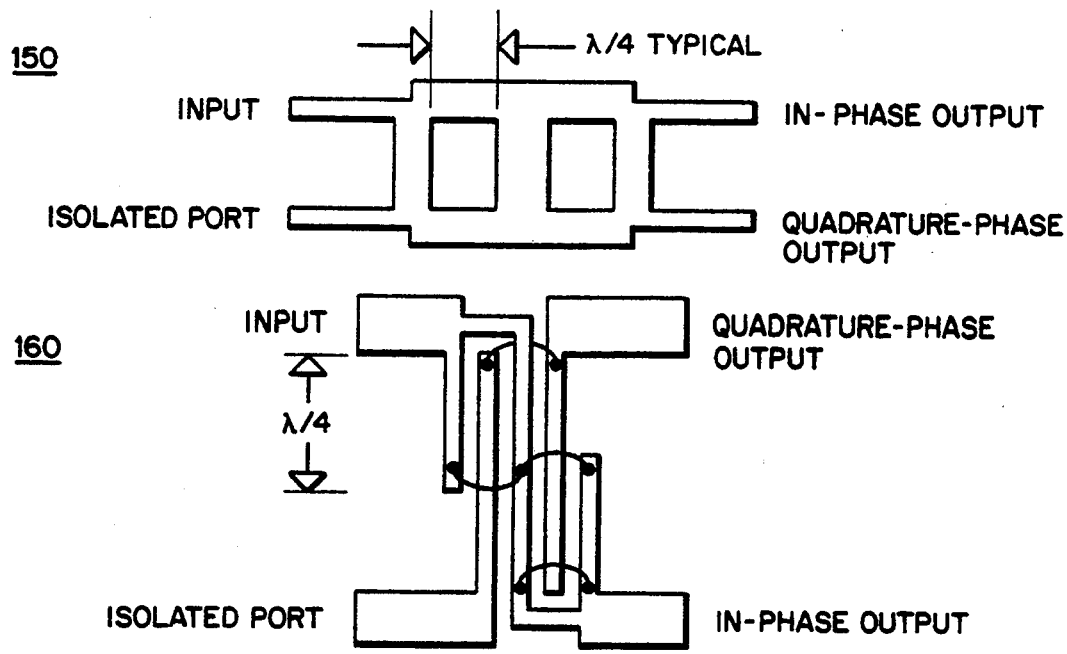
FIG. 2 is an illustration of a coupled transmission line quadrature network.
Figure 3:
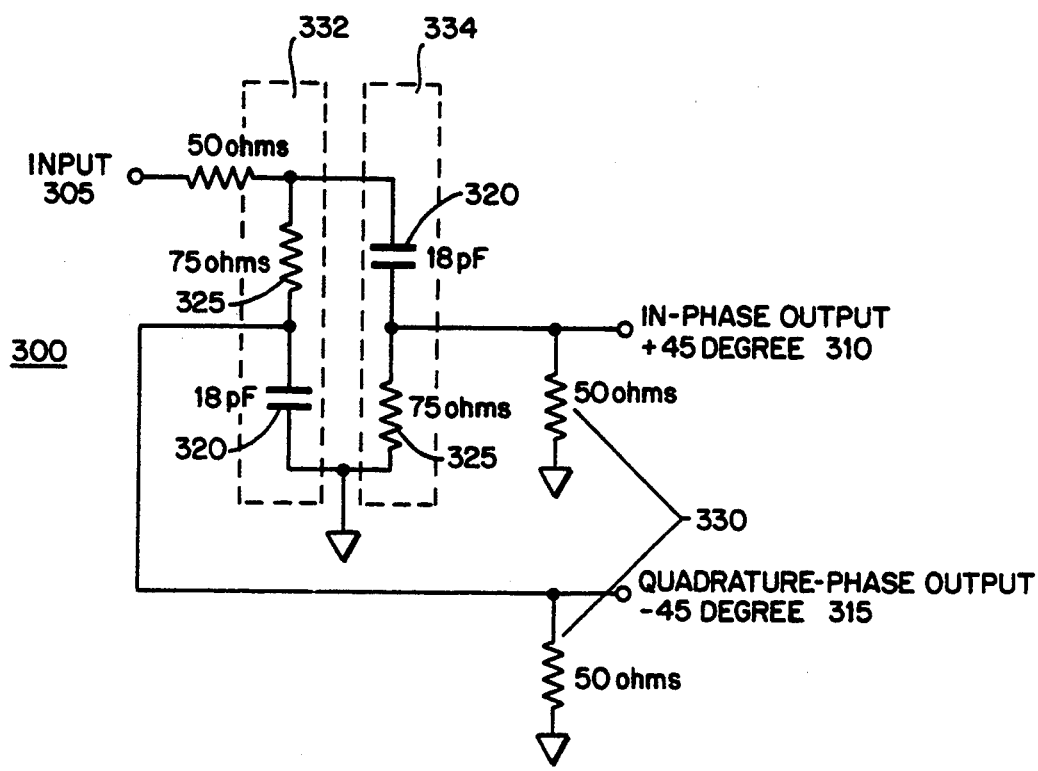
FIG. 3 is a schematic of an RC quadrature network.
Figure 4A:
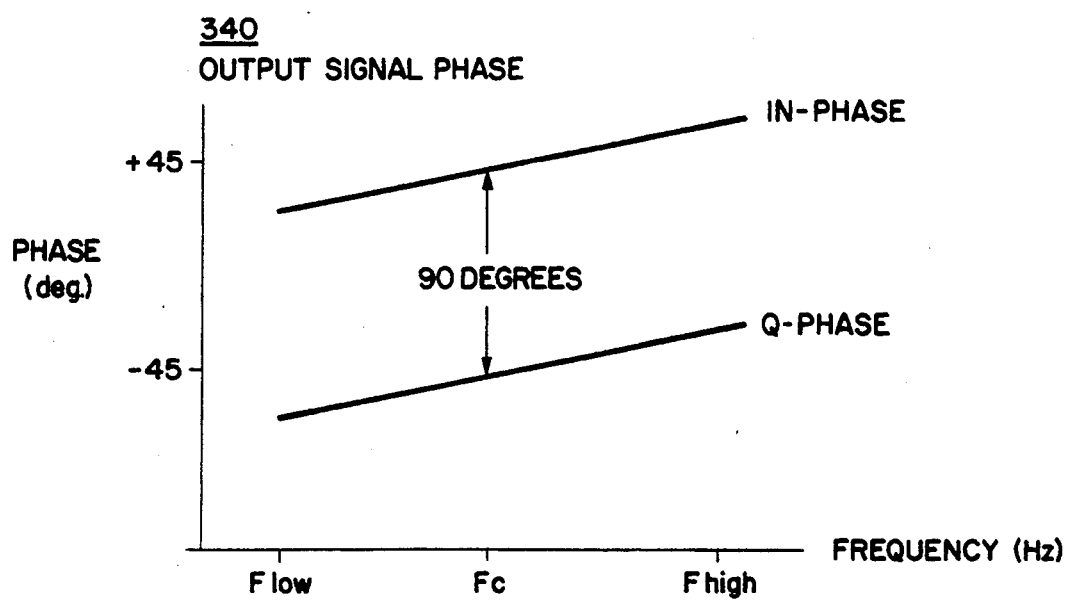
FIGS. 4 (a)–4(b) are graphs illustrating the operation of the network shown in FIG. 3.
Figure 4B:
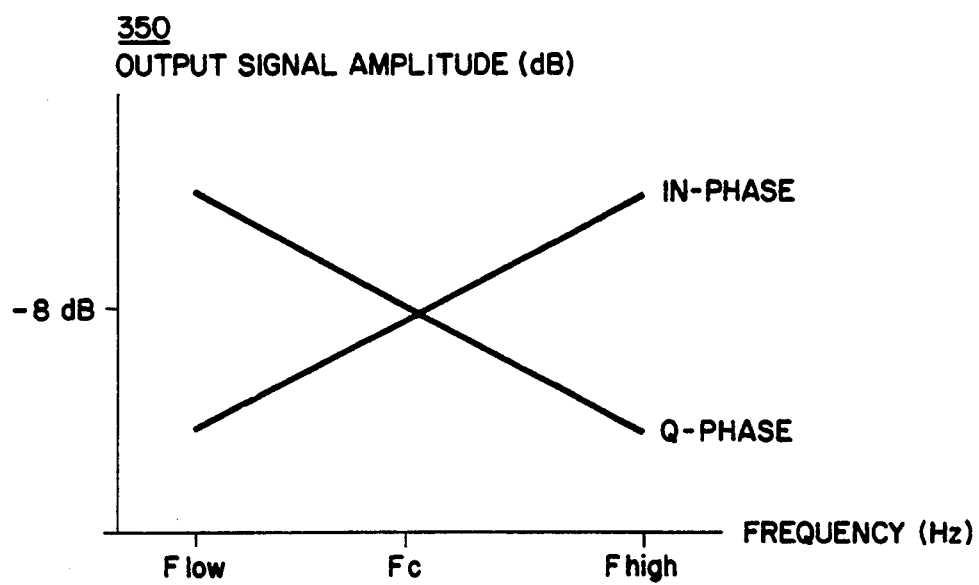
Figure 5C:
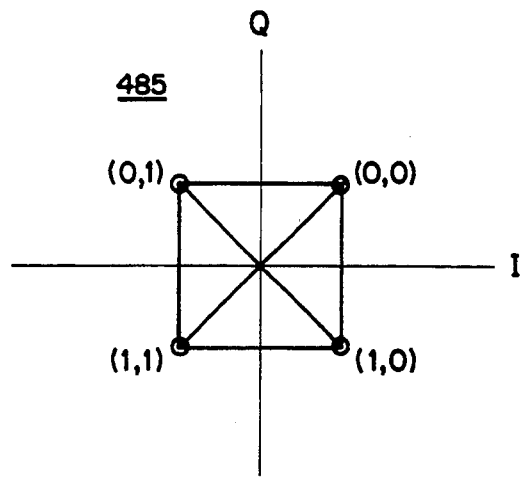
Figure 7:
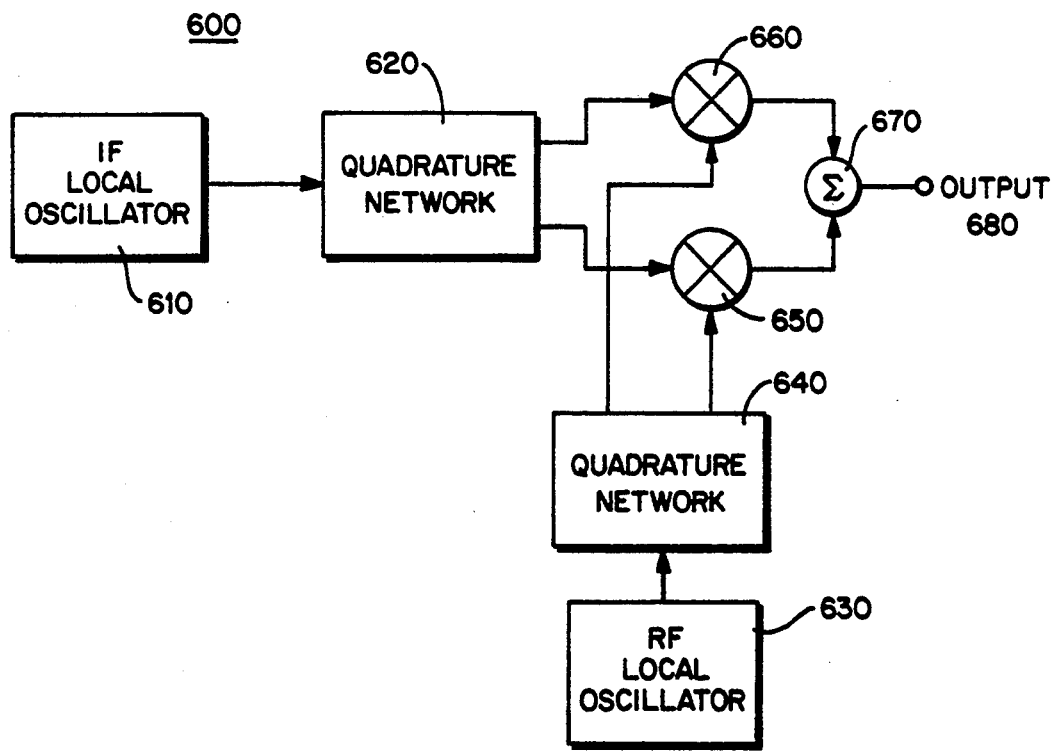
FIG. 7 shows a SSB upconverter using quadrature networks.
Figure 6B:
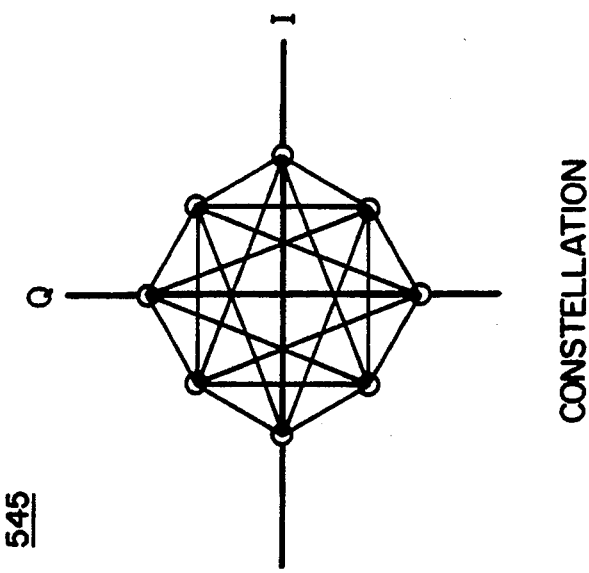
FIGS. 6(a)–6(b) show a $\pi/4$-shifted QPSK modulator and the resulting constellation.
Figure 6A:
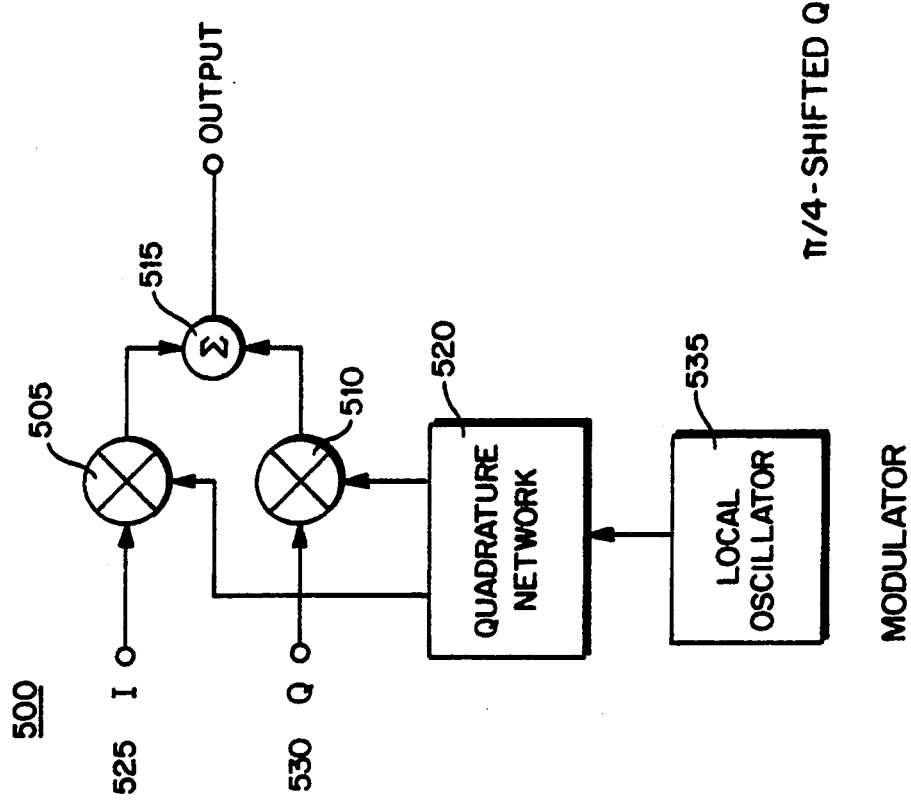

An IF signal 760 of arbitrary phase and angular frequency $\omega_1$ and an RF signal 765 of arbitrary phase with angular frequency $\omega_2$ are input into respective quadrature networks 705, 740. In the preferred embodiment, quadrature networks 705, 740 each may be constructed as the reactive network illustrated in FIG. 3. Other types of conventional quadrature networks (some of which were described above) suitable for a particular application may also be used. The in-phase (A) and quadrature (B) outputs of the IF network 705 may be written respectively as $\cos(\omega_1 t)$ and $\sin(\omega_1 t)$. Similarly, the in-phase (C) and quadrature (D) outputs of the RF network 740 may be written respectively as $\cos(\omega_2 t)$ and $\sin(\omega_2 t)$.

Mixer 710 accepts the in-phase signals from the IF quadrature network 705 and the RF quadrature network 740 and multiplies them together to produce:

$$\cos(\omega_1 t)\cos(\omega_2 t)$$

Mixer 720 accepts the quadrature-phase signals from the IF quadrature network 705 and RF quadrature network 740 multiplies them together to produce:

$$\sin(\omega_1 t)\sin(\omega_2 t)$$

These signals are then summed in summer 730 to produce the in-phase local oscillator signal L01:

$$L01 = \cos(\omega_1 t)\cos(\omega_2 t) + \sin(\omega_1 t)\sin(\omega_2 t)$$

This can be expanded by applying well-known trigonometric identities as:

$$L01 = \tfrac{1}{2}\cos(\omega_1-\omega_2)t + \tfrac{1}{2}\cos(\omega_1+\omega_2)t + \tfrac{1}{2}\cos(\omega_1-\omega_2)t - \tfrac{1}{2}\cos(\omega_1+\omega_2)t$$

Which can be further simplified as:

$$L01 = \cos(\omega_1-\omega_2)t$$

Similarly, mixer 715 multiplies the quadrature-phase signal from the IF network 705 and the in-phase signal from the RF network 740 to produce:

$$\sin(\omega_1 t)\cos(\omega_2 t)$$

Mixer 725 multiplies the in-phase signal from the IF network 705 and the quadrature-phase signal from the RF network 740 to produce:

$$\cos(\omega_1 t)\sin(\omega_2 t)$$

These signals are then subtracted in combiner 735 to produce the quadrature-phase local oscillator signal L02 790:

$$L02 = \sin(\omega_1 t)\cos(\omega_2 t) - \cos(\omega_1 t)\sin(\omega_2 t)$$

This can also be expanded by applying well-known trigonometric identities:

$$L02 = \tfrac{1}{2}\sin(\omega_1+\omega_2)t + \tfrac{1}{2}\sin(\omega_1-\omega_2)t - \tfrac{1}{2}\sin(\omega_1+\omega_2)t + \tfrac{1}{2}\sin(\omega_1-\omega_2)t$$

Which can be further simplified as:

$$L02 = \sin(\omega_1-\omega_2)t$$

So the outputs of the quadrature network 700 are the equal amplitude quadrature signals L01 and L02:

$L01 = \cos(\omega_1-\omega_2)t$
$L02 = \sin(\omega_1-\omega_2)t$

Those of ordinary skill will of course appreciate that the quadrature network 700 according to the present invention could readily be configured to provide the sum frequency rather than the difference frequency.

A significant advantage of quadrature network 700 according to the present invention is that phase and amplitude errors within or introduced into the circuit do not substantially affect the quadrature phase and amplitude balance of the output signals 785, 790. Instead, the present invention causes such errors to manifest themselves as spurious outputs which can be easily filtered from the output.

Consider for example, an amplitude imbalance, x, introduced in the in-phase output of the IF network 705 as:

$$(1+x)\cos(\omega_1 t)$$

In this case, mixer 710 multiplies the in-phase signal having amplitude error x from the IF quadrature network 705 with the in-phase signal from the RF quadrature network 740 to produce:

$$(1+x)\cos(\omega_1 t)\cos(\omega_2 t)$$

As before, mixer 720 accepts the quadrature signals from the IF and RF networks 705 and 740 and multiplies them together to produce:

$$\sin(\omega_1 t)\sin(\omega_2 t)$$

These signals are then summed 730 to produce the in-phase local oscillator signal 785:

$$LO1 = (1+x)\cos(\omega_1 t)\cos(\omega_2 t) + \sin(\omega_1 t)\sin(\omega_2 t)$$

This can be expanded by applying well-known trigonometric identities as:

$$\begin{aligned}LO1 = &\tfrac{1}{2}\cos(\omega_1 - \omega_2)t + \tfrac{1}{2}\cos(\omega_1 + \omega_2)t + \\ &\tfrac{1}{2}\cos(\omega_1 - \omega_2)t - \tfrac{1}{2}\cos(\omega_1 + \omega_2)t + \\ &(x/2)\cos(\omega_1 - \omega_2)t + \\ &(x/2)\cos(\omega_1 + \omega_2)t\end{aligned}$$

Which can be further simplified as:

$$LO1 = (1+x/2)\cos(\omega_1 - \omega_2)t + (x/2)\cos(\omega_1 + \omega_2)t$$

Similarly, mixer 715 multiplies the quadrature signal from the IF quadrature network 705 and the in-phase signal from the RF quadrature network 740 to produce:

$$\sin(\omega_1 t)\cos(\omega_2 t)$$

Mixer 725 multiplies the in-phase signal from the IF network 705 with amplitude error, x, and the quadrature signal from the RF network 740 to produce:

$$(1+x)\cos(\omega_1 t)\sin(\omega_2 t)$$

These signals are then subtracted in combiner 735 to produce the quadrature local oscillator signal 790:

$$LO2 = \sin(\omega_1 t)\cos(\omega_2 t) - (1+x)\cos(\omega_1 t)\sin(\omega_2 t)$$

This can also be expanded by applying well-known trigonometric identities as:

$$\begin{aligned}LO2 = &\tfrac{1}{2}\sin(\omega_1 + \omega_2)t + \tfrac{1}{2}\sin(\omega_1 - \omega_2)t - \\ &\tfrac{1}{2}\sin(\omega_1 + \omega_2)t + \tfrac{1}{2}\sin(\omega_1 - \omega_2)t - \\ &(x/2)\sin(\omega_1 + \omega_2)t + \\ &(x/2)\sin(\omega_1 - \omega_2)t\end{aligned}$$

Which can be further simplified as:

$$LO2 = (1+x/2)\sin(\omega_1 - \omega_2)t - (x/2)\sin(\omega_1 + \omega_2)t$$

So the outputs 785, 790 of quadrature network 700 with an amplitude imbalance are two equal amplitude quadrature signals and an additional frequency component:

$$LO1 = (1 + x/2)\cos(\omega_1 - \omega_2)t + (x/2)\cos(\omega_1 + \omega_2)t$$

$$LO2 = (1 + x/2)\sin(\omega_1 - \omega_2)t - (x/2)\sin(\omega_1 + \omega_2)t$$

After low-pass filtering, only the desired outputs 785, 790 remain:

$$LO1 = (1+x/2)\cos(\omega_1 - \omega_2)t$$
$$LO2 = (1+x/2)\sin(\omega_1 - \omega_2)t$$

Again, quadrature network 400 could also provide the sum frequency.

The quadrature network 700 according to the present invention also provides balanced quadrature outputs that are insensitive to internal phase errors. For example: a phase imbalance, $\phi$, introduced to the quadrature output of the IF network 705 can be written and expanded as:

$$\begin{aligned}\sin(\omega_1 t + \phi) &= \sin(\omega_1 t)\cos(\phi) + \cos(\omega_1 t)\sin(\phi) \\ &= \sin(\omega_1 t) + [\cos(\phi) - 1]\sin(\omega_1 t) + \\ &\quad \cos(\omega_1 t)\sin(\phi)\end{aligned}$$

In this case, mixer 710 multiplies an in-phase signal from the IF network 705 and the in-phase signal from the RF network 740 to produce:

$$\cos(\omega_1 t)\cos(\omega_2 t)$$

As before, mixer 720 multiplies the quadrature-phase signal from the IF 705 network which includes a phase error, $\phi$, and the quadrature-phase output from the RF 740 network to produce:

$$\sin(\omega_1 t \phi)\sin(\omega_2 t)$$

These signals are then summed 730 to produce the in-phase local oscillator signal 785:

$$LO1 = \cos(\omega_1 t)\cos(\omega_2 t) + \sin(\omega_1 t + \phi)\sin(\omega_2 t)$$

This can be expanded by applying well-known trigonometric identities as:

$$\begin{aligned}LO1 &= \tfrac{1}{2}\cos(\omega_1 - \omega_2)t + \\ &\quad \tfrac{1}{2}\cos(\omega_1 + \omega_2)t + \{\sin(\omega_1 t)\cos(\phi) + \\ &\quad \cos(\omega_1 t)\sin(\phi)\}\sin(\omega_2 t) \\ &= \tfrac{1}{2}\cos(\omega_1 - \omega_2)t + \tfrac{1}{2}\cos(\omega_1 + \omega_2)t + \\ &\quad \sin(\omega_1 t)\sin(\omega_2 t)\cos(\phi) + \\ &\quad \cos(\omega_1 t)\sin(\omega_2 t)\sin(\phi)\end{aligned}$$

Which can be further simplified as:

$$\begin{aligned}LO1 = &\tfrac{1}{2}\cos(\omega_1 - \omega_2)t + \\ &\tfrac{1}{2}\cos(\omega_1 + \omega_2)t + \\ &\cos(\phi)\{\tfrac{1}{2}\cos(\omega_1 - \omega_2)t - \\ &\tfrac{1}{2}\cos(\omega_1 + \omega_2)t\} + \\ &\sin(\phi)\{\tfrac{1}{2}\sin(\omega_1 + \omega_2)t - \\ &\tfrac{1}{2}\sin(\omega_1 - \omega_2)t\}\end{aligned}$$

Collecting terms results in:

$$\begin{aligned}LO1 = &\cos(\omega_1 - \omega_2)t\{\tfrac{1}{2} + \tfrac{1}{2}\cos(\phi)\} + \\ &\cos(\omega_1 + \omega_2)t\{\tfrac{1}{2} - \tfrac{1}{2}\cos(\phi)\} + \\ &\tfrac{1}{2}\sin(\phi)\sin(\omega_1 + \omega_2)t - \\ &\tfrac{1}{2}\sin(\phi)\sin(\omega_1 - \omega_2)t\end{aligned}$$

Similarly, mixer 715 multiplies the quadrature-phase signal from the IF network 705 with phase error, $\phi$, and the in-phase signal from the RF network 740 to produce:

$$\sin(\omega_1 t + \phi)\cos(\omega_2 t)$$

Mixer 725 multiplies the in-phase signal from the IF network 705 and the quadrature-phase signal from the RF network 740 to produce:

$$\cos(\omega_1 t)\sin(\omega_2 t)$$

These signals are then subtracted 735 to produce the quadrature-phase local oscillator signal 790:

$$LO2 = \sin(\omega_1 t + \phi)\cos(\omega_2 t) - \cos(\omega_1 t)\sin(\omega_2 t)$$

This can also be expanded by applying well-known trigonometric identities as:

$$\begin{aligned}
LO2 &= \cos(\omega_2 t)\{\sin(\omega_1 t)\cos(\phi) + \\
&\quad \cos(\omega_1 t)\sin(\phi)\} - \{\tfrac{1}{2}\sin(\omega_1 + \omega_2)t - \\
&\quad \tfrac{1}{2}\sin(\omega_1 - \omega_2)t\} \\
&= \cos(\phi)\sin(\omega_1 t)\cos(\omega_2 t) + \\
&\quad \sin(\phi)\cos(\omega_1 t)\cos(\omega_2 t) - \\
&\quad \tfrac{1}{2}\sin(\omega_1 + \omega_2)t + \\
&\quad \tfrac{1}{2}\sin(\omega_1 - \omega_2)t \\
&= \cos(\phi)\{\tfrac{1}{2}\sin(\omega_1 + \omega_2)t + \\
&\quad \tfrac{1}{2}\sin(\omega_1 - \omega_2)t\} + \\
&\quad \sin(\phi)\{\tfrac{1}{2}\cos(\omega_1 - \omega_2)t + \\
&\quad \tfrac{1}{2}\cos(\omega_1 + \omega_2)t\} - \tfrac{1}{2}\sin(\omega_1 + \omega_2)t + \\
&\quad \tfrac{1}{2}\sin(\omega_1 - \omega_2)t
\end{aligned}$$

Which can be further simplified as:

$$\begin{aligned}
LO2 &= \sin(\omega_1 - \omega_2)t\{\tfrac{1}{2} + \tfrac{1}{2}\cos(\phi)\} + \\
&\quad \sin(\omega_1 + \omega_2)t\{-\tfrac{1}{2} + \tfrac{1}{2}\cos(\phi)\} + \\
&\quad \tfrac{1}{2}\sin(\phi)\cos(\omega_1 + \omega_2)t + \\
&\quad \tfrac{1}{2}\sin(\phi)\cos(\omega_1 - \omega_2)t
\end{aligned}$$

So the outputs 785, 790 of the improved quadrature network with internal phase imbalance are two equal amplitude quadrature signals and additional frequency components:

$$\begin{aligned}
LO1 &= \cos(\omega_1 - \omega_2)t\{\tfrac{1}{2} + \tfrac{1}{2}\cos(\phi)\} + \\
&\quad \cos(\omega_1 + \omega_2)t\{\tfrac{1}{2} - \tfrac{1}{2}\cos(\phi)\} + \\
&\quad \tfrac{1}{2}\sin(\phi)\sin(\omega_1 + \omega_2)t - \\
&\quad \tfrac{1}{2}\sin(\phi)\sin(\omega_1 - \omega_2)t
\end{aligned}$$

$$\begin{aligned}
LO2 &= \sin(\omega_1 - \omega_2)t\{\tfrac{1}{2} + \tfrac{1}{2}\cos(\phi)\} + \\
&\quad \sin(\omega_1 + \omega_2)t\{-\tfrac{1}{2} + \tfrac{1}{2}\cos(\phi)\} + \\
&\quad \tfrac{1}{2}\sin(\phi)\cos(\omega_1 + \omega_2)t + \\
&\quad \tfrac{1}{2}\sin(\phi)\cos(\omega_1 - \omega_2)t
\end{aligned}$$

After low-pass filtering, the outputs 785, 790 remain:

$$\begin{aligned}
LO1 &= \cos(\omega_1 - \omega_2)t\{\tfrac{1}{2} + \tfrac{1}{2}\cos(\phi)\} - \\
&\quad \tfrac{1}{2}\sin(\phi)\sin(\omega_1 - \omega_2)t
\end{aligned}$$

$$\begin{aligned}
LO2 &= \sin(\omega_1 - \omega_2)t\{\tfrac{1}{2} + \tfrac{1}{2}\cos(\phi)\} + \\
&\quad \tfrac{1}{2}\sin(\phi)\cos(\omega_1 - \omega_2)t
\end{aligned}$$

LO1 and LO2 are substantially equal amplitude signals with a quadrature phase relationship.

Once more quadrature network 700 could equally provide the sum frequency. Furthermore, those skilled in the art will appreciate that the present invention may readily be used in a QPSK demodulator, as opposed to the modulator presented herein. In addition, amplitude limiting amplifiers 795 and 796 may be connected between corresponding mixers 730 and 735 and local oscillators 745 and 750. Limiting amplifiers 795 and 796 are particularly desirable if mixers 745 and 750 are linear (i.e., non-limiting).

As can be seen from the examples set forth above, for most amplitude and/or phase imbalances in the phase shifting quadrature network 705 and 740, the present invention substantially eliminates those errors in the quadrature outputs LO1 and LO2. However, certain combinations of plural amplitude errors and/or phase errors in the quadrature local oscillator network 700 may result in a small second order amplitude or phase error. For instance, if an amplitude error X in quadrature network 705 is combined with a phase error $\Delta\phi$ in quadrature network 740, a small phase error is generated between the local oscillator output LO1 and LO2. This minimal error can be approximated using the following equation $(X \cdot \Delta\phi)/2$. Thus, for an amplitude error $X = 5\%$ and a phase error $\Delta\phi = 5°$, a 0.125° phase error occurs, which for virtually all applications is insignificant. Nonetheless, in most instances, the present invention completely eliminates amplitude and phase imbalances in the quadrature networks 705 and 740.

Figure 9:
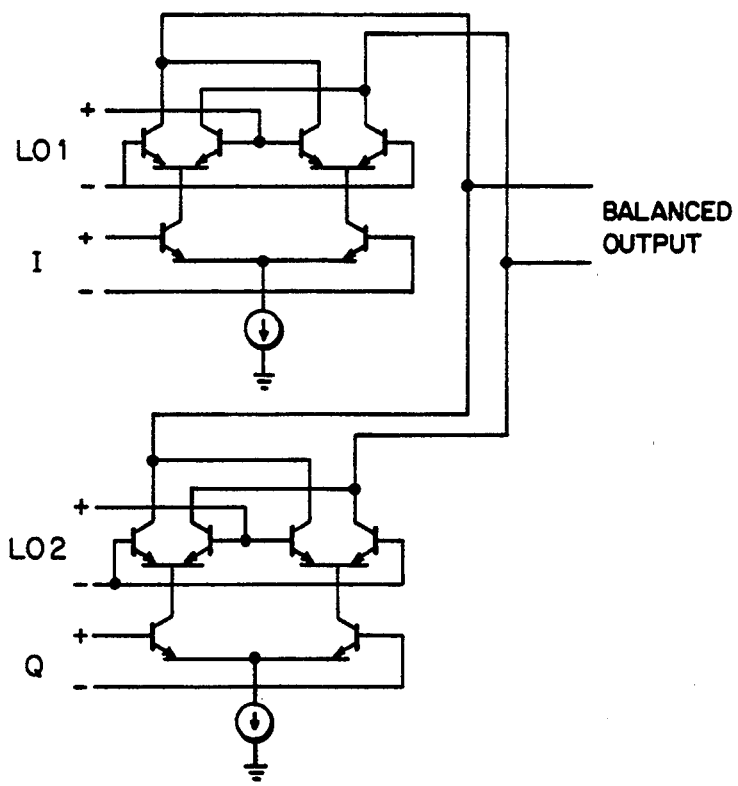
FIG. 9 is a schematic of two Gilbert cell multipliers summed together that may be used in implementing a preferred embodiment of the present invention.

In the preferred embodiment, the invention is part of a monolithic semiconductor device, or ASIC. In an ASIC design, the various mixers used in the quadrature network 730 may be implemented using well know Gilbert cell multipliers. For example, FIG. 9 shows two Gilbert cell multipliers configured (summed together) to implement a quadrature modulator in accordance with the present invention. Summing junctions can be effected by simply connecting the transistor collectors together. This arrangement is known as cross-coupled collectors. Such an ASIC design implementation of the present invention is particularly advantageous in mobile/portable radio communications and may be used in transceivers of radiotelephones and base stations. Of course, any communications application desiring accurate quadrature signal generation would benefit from the present invention.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the claims which follow.

What is claimed is:

1. A method for demodulating a quadrature modulated signal using an apparatus for generating quadrature signals comprising: first and second single side band (SSB) networks receiving first and second input signals, wherein the first SSB network mixes in-phase components of the first and second input signals and quadrature components of the first and second input signals and combines these first mixed signals to generate an in-phase signal, and the second SSB network selectively mixes in-phase and quadrature components of the input signals and combines the selectively mixed signals to generate a quadrature signal such that the in-phase and quadrature signals are equal in amplitude and out of phase by 90°.

2. A quadrature local oscillator network comprising:
a first quadrature circuit for dividing a first input signal into a first in-phase signal and a first quadrature signal 90° out of phase;
a second quadrature circuit for dividing a second input signal into a second in-phase signal and a second quadrature signal 90° out of phase;
a first mixer for mixing said first in-phase signal and said second in-phase signal;
a second mixer for mixing said first quadrature signal and said second quadrature signal;
a third mixer for mixing said first quadrature signal and said second in-phase signal;
a fourth mixer for mixing said first in-phase signal and said second quadrature signal;
a first combiner for combining the outputs of said first and second mixers into a first local oscillator output signal;
a second combiner for combining the outputs of said third and fourth mixers into a second local oscillator output signal;
a first amplitude limiting amplifier connected to the first combiner; and
a second amplitude limiting amplifier connected to the second combiner, wherein said first and second local oscillator output signals have substantially equal amplitudes and a substantially balanced quadrature phase relationship.

3. A method of quadrature modulating and demodulating signals in the transceiver of a portable radiotelephone using a quadrature local oscillator network comprising a first quadrature circuit for dividing a first input signal into a first in-phase signal and a first quadrature signal 90° out of phase; a second quadrature circuit for dividing a second input signal into a second in-phase signal and a second quadrature signal 90° out of phase; a first mixer for mixing said first in-phase signal and said second in-phase signal; a second mixer for mixing said first quadrature signal and said second quadrature signal; a third mixer for mixing said first quadrature signal and said second in-phase signal; a fourth mixer for mixing said first in-phase signal and said second quadrature signal; a first combiner for combining the outputs of said first and second mixers into a first local oscillator output signal; and a second combiner for combining the outputs of said third and fourth mixers into a second local oscillator output signal 4. A method of quadrature modulating and demodulating signals in the transceiver of a base station using a quadrature local oscillator network comprising: a first quadrature circuit for dividing a first input signal into a first in-phase signal and a first quadrature signal 90° out of phase; a second quadrature circuit for dividing a second input signal into a second in-phase signal and a second quadrature signal 90° out of phase; a first mixer for mixing said first in-phase signal and said second in-phase signal; a second mixer for mixing said first quadrature signal and said second quadrature signal; a third mixer for mixing said first quadrature signal and said second in-phase signal; a fourth mixer for mixing said first in-phase signal and said second quadrature signal; a first combiner for combining the outputs of said first and second mixers into a first local oscillator output signal; and a second combiner for combining the outputs of said third and fourth mixers into a second local oscillator output signal.

5. A quadrature modulator comprising:
a first quadrature circuit for dividing a first input signal into a first in-phase signal and a first quadrature signal 90° out of phase;
a second quadrature circuit for dividing a second input signal into a second in-phase signal and a second quadrature signal 90° out of phase;
a first mixer for mixing said first in-phase signal and said second in-phase signal;
a second mixer for mixing said first quadrature signal and said second quadrature signal;
a third mixer for mixing said first quadrature signal and said second in-phase signal;
a fourth mixer for mixing said first in-phase signal and said second quadrature signal;
a first combiner for combining the outputs of said first and second mixers into a first local oscillator output signal;
a second combiner for combining the outputs of said third and fourth mixers into a second local oscillator output signal;
said first and second local oscillator output signals have equal amplitudes and a balanced quadrature phase relationship;
a fifth mixer for mixing a first data signal and said first local oscillator output signal to produce a first modulated signal;
a sixth mixer for mixing a second data signal and said second local oscillator output signal to produce a second modulated signal; and
a third combiner for combining said first and second modulated signals to produce an output quadrature modulated signal.

6. The quadrature modulator according to claim 5 wherein said first and said second quadrature circuits are high-pass/low-pass filter networks.

7. The quadrature modulator according to claim 5 wherein said mixers are Gilbert cell multipliers.

8. The quadrature modulator according to claim 5 wherein the modulator is constructed as part of an ASIC device.

9. The quadrature modulator according to claim 5 wherein said first data signal and said second data signal are I and Q pairs, respectively.

10. The quadrature modulator according to claim 9 wherein said output quadrature modulated signal is a QPSK modulated RF signal.

11. The quadrature modulator according to claim 5, further comprising:
a first amplitude limiting amplifier connected to the first combiner, and
a second amplitude limiting amplifier connected to the second combiner.

12. A quadrature modulator, comprising:
first and second single side band (SSB) networks receiving first and second input signals, wherein the first SSB network mixes in-phase components of the first and second input signals and quadrature components of the first and second input signals and combines these first mixed signals to generate an in-phase signal, and the second SSB network selectively mixes in-phase and quadrature components of the input signals and combines the selectively mixed signals to generate a quadrature signal such that the in-phase and quadrature signals are equal in amplitude and out of phase by 90°;

a first mixer for mixing the in-phase signal with a first data signal to produce a first modulated signal;

a second mixer for mixing the quadrature signal with a second data signal to produce a second modulated signal; and a combiner for combining the first and second modulated signals to produce a quadrature modulated output signal.

13. The quadrature modulator according to claim 12, wherein any amplitude imbalance between any of the in-phase or quadrature components is substantially eliminated.

14. The quadrature modulator according to claim 12, wherein any phase imbalance between any of the in-phase or quadrature components is substantially eliminated.

15. The quadrature modulator according to claim 12, wherein the apparatus is substantially insensitive to phase or amplitude imbalances between any in-phase or quadrature components.

16. The quadrature modulator according to claim 12, wherein the first SSB network sums the first mixed signals and the second SSB network differences the selectively mixed signals.

17. The quadrature modulator according to claim 12, wherein the first and second SSB networks include:

means for generating an in-phase component and a quadrature component from an input signal.

18. The quadrature modulator according to claim 17, wherein the means for generating is a reactive quadrature network.

19. The quadrature modulator according to claim 12, further comprising:

amplitude limiters for receiving and limiting the amplitude of the in-phase and quadrature signals.

20. A method for modulating in-phase and quadrature signals with one or more quadrature data pairs using an apparatus for generating quadrature signals comprising first and second single side band (SSB) networks receiving first and second input signals, wherein the first SSB network mixes in-phase components of the first and second input signals and quadrature components of the first and second input signals and combines these first mixed signals to generate an in-phase signal, and the second SSB network selectively mixes in-phase and quadrature components of the input signals and combines the selectively mixed signals to generate a quadrature signal such that the in-phase and quadrature signals are equal in amplitude and out of phase by 90°.

* * * * *